(12) United States Patent
Kim et al.

(10) Patent No.: US 12,446,262 B2
(45) Date of Patent: Oct. 14, 2025

(54) SEMICONDUCTOR DEVICES

(71) Applicant: SAMSUNG ELECTRONICS CO., LTD., Suwon-si (KR)

(72) Inventors: Gyeom Kim, Suwon-si (KR); Jinbum Kim, Suwon-si (KR); Dahye Kim, Suwon-si (KR); Kyungbin Chun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 418 days.

(21) Appl. No.: 18/128,417

(22) Filed: Mar. 30, 2023

(65) Prior Publication Data

US 2024/0006503 A1   Jan. 4, 2024

(30) Foreign Application Priority Data

Jun. 29, 2022   (KR) .......................... 10-2022-0079522

(51) Int. Cl.
*H01L 29/423*   (2006.01)
*H01L 29/06*   (2006.01)
(Continued)

(52) U.S. Cl.
CPC ......... *H10D 30/6735* (2025.01); *H10D 30/43* (2025.01); *H10D 30/6757* (2025.01); *H10D 62/121* (2025.01); *H10D 64/017* (2025.01)

(58) Field of Classification Search
CPC .... H10D 30/014; H10D 30/024; H10D 30/43; H10D 30/62; H10D 30/6211; H10D 30/6212; H10D 30/6213; H10D 30/6219; H10D 30/6713; H10D 30/6735; H10D 30/6757; H10D 30/797; H10D 62/021; H10D 62/118; H10D 62/119;
(Continued)

(56) References Cited

U.S. PATENT DOCUMENTS

| | | |
|---|---|---|
| 10,263,100 B1 | 4/2019 | Bi et al. |
| 2019/0267494 A1 | 8/2019 | Kim et al. |

(Continued)

FOREIGN PATENT DOCUMENTS

| | | |
|---|---|---|
| KR | 10-2019-0101609 A | 9/2019 |
| KR | 10-2020-0007452 A | 1/2020 |

(Continued)

*Primary Examiner* — David C Spalla
(74) *Attorney, Agent, or Firm* — Sughrue Mion, PLLC

(57) ABSTRACT

A semiconductor device is provided. The semiconductor device includes: a substrate including an active region; a gate structure intersecting the active region on the substrate; channel layers on the active region, spaced apart from each other and surrounded by the gate structure; and a source/drain region on the active region adjacent the gate structure and connected to the plurality of channel layers. The source/drain region includes: a first semiconductor layer on side surfaces of the channel layers; a diffusion barrier layer on an upper region of the first semiconductor layer and including carbon, wherein an upper surface of a first channel layer that is a lowermost channel layer among the plurality of channel layers is provided between the substrate and a lower end of the diffusion barrier layer; and a second semiconductor layer on the diffusion barrier layer and the first semiconductor layer.

20 Claims, 16 Drawing Sheets

(51) Int. Cl.
    *H01L 29/66*     (2006.01)
    *H01L 29/775*     (2006.01)
    *H01L 29/786*     (2006.01)
    *H10D 30/43*     (2025.01)
    *H10D 30/67*     (2025.01)
    *H10D 62/10*     (2025.01)
    *H10D 64/01*     (2025.01)

(58) Field of Classification Search
    CPC .. H10D 62/121; H10D 62/149; H10D 62/151; H10D 84/013; H10D 84/0158; H10D 84/017; H10D 84/0193; H10D 84/834; H10D 84/853

See application file for complete search history.

(56) References Cited

U.S. PATENT DOCUMENTS

| | | | |
|---|---|---|---|
| 2020/0020774 A1* | 1/2020 | Lee | H10D 62/121 |
| 2020/0044045 A1 | 2/2020 | Wang et al. | |
| 2021/0234047 A1 | 7/2021 | Tsai et al. | |
| 2021/0328020 A1 | 10/2021 | Chung et al. | |
| 2021/0376093 A1 | 12/2021 | Chu et al. | |
| 2022/0052203 A1 | 2/2022 | More | |
| 2022/0069134 A1* | 3/2022 | Kim | H10D 30/6729 |
| 2022/0069135 A1 | 3/2022 | Chu et al. | |
| 2022/0102522 A1* | 3/2022 | Dewey | H10D 30/6219 |
| 2023/0121210 A1* | 4/2023 | Wang | H10D 84/038 |
| | | | 257/774 |

FOREIGN PATENT DOCUMENTS

| | | |
|---|---|---|
| KR | 10-2021-0148825 A | 12/2021 |
| KR | 10-2022-0021850 A | 2/2022 |

* cited by examiner

SEMICONDUCTOR DEVICES

CROSS-REFERENCE TO RELATED APPLICATION

This application claims priority to Korean Patent Application No. 10-2022-0079522, filed on Jun. 29, 2022, in the Korean Intellectual Property Office, the disclosure of which is incorporated by reference herein in its entirety.

BACKGROUND

The present disclosure relates to a semiconductor device.

Due to demand for high performance, high speed, and multifunctionality of semiconductor devices, semiconductor device are increasingly integrated. In this regard, there is a need to a semiconductor device having a fine pattern. In manufacturing the semiconductor device having the fine pattern, it is necessary to implement patterns having a fine width and a narrow separation distance. In addition, in order to reduce operating characteristics limitations due to the size reduction of planar metal oxide semiconductor FET (MOSFET), efforts are being made to develop a semiconductor device including a FinFET having a channel having a three-dimensional structure.

SUMMARY

Example embodiments provide a semiconductor device having improved reliability.

According to example embodiments, a semiconductor device includes: a substrate including an active region extending in a first direction; a gate structure extending in a second direction and intersecting the active region, on the substrate; a plurality of channel layers on the active region, spaced apart from each other in a third direction perpendicular to an upper surface of the substrate, and surrounded by the gate structure; and a source/drain region on the active region adjacent the gate structure and connected to the plurality of channel layers. The source/drain region includes: a first semiconductor layer on side surfaces of the plurality of channel layers; a diffusion barrier layer on an upper region of the first semiconductor layer and including carbon, wherein an upper surface of a first channel layer that is a lowermost channel layer among the plurality of channel layers is provided between the substrate and a lower end of the diffusion barrier layer; and a second semiconductor layer on the diffusion barrier layer and the first semiconductor layer.

According to example embodiments, a semiconductor device includes: a substrate including an active region extending in a first direction; a gate structure on the substrate, intersecting the active region and extending in a second direction; and a source/drain region provided in a recess region defined by the active region adjacent the gate structure. The source/drain region includes: a first semiconductor layer on inner side surface of the recess region; diffusion barrier layers on upper ends of the first semiconductor layer and extending in directions oblique to the first direction; and a second semiconductor layer on the diffusion barrier layers and the first semiconductor layer. The diffusion barrier layers are spaced apart from each other in the source/drain region in the first direction.

According to example embodiments, a semiconductor device includes: a substrate including an active region extending in a first direction; a gate structure on the substrate, intersecting the active region, and extending in a second direction; a plurality of channel layers on the active region, spaced apart from each other in a third direction perpendicular to an upper surface of the substrate, and surrounded by the gate structure; and a source/drain region on the active region adjacent the gate structure, and connected to the plurality of channel layers. The source/drain region includes: a first semiconductor layer on side surfaces of the plurality of channel layers; a second semiconductor layer on the first semiconductor layer; and a plurality of diffusion barrier layers between the first semiconductor layer and the second semiconductor layer.

BRIEF DESCRIPTION OF DRAWINGS

The above and other aspects and features will be more apparent from the following description of example embodiments, taken in conjunction with the accompanying drawings, in which.

DETAILED DESCRIPTION

Figure 1:
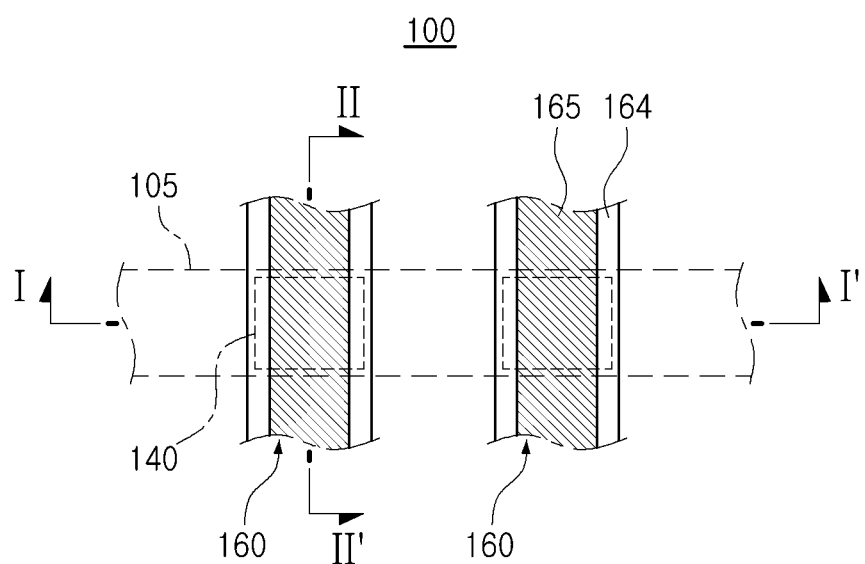
FIG. 1 is a plan view illustrating a semiconductor device according to example embodiments.

Hereinafter, example embodiments will be described with reference to the accompanying drawings. Embodiments described herein are provided as examples, and thus, the present disclosure is not limited thereto, and may be realized in various other forms. Each example embodiment provided in the following description is not excluded from being associated with one or more features of another example or another example embodiment also provided herein or not provided herein but consistent with the present disclosure. Terms such as "on," "upper," "upper surface," below," "lower portion," "lower surface," "side," and the like may be understood as referring to the drawings, except where indicated by reference numerals and otherwise indicated. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

FIG. 1 is a plan view illustrating a semiconductor device according to example embodiments.

Figure 2:
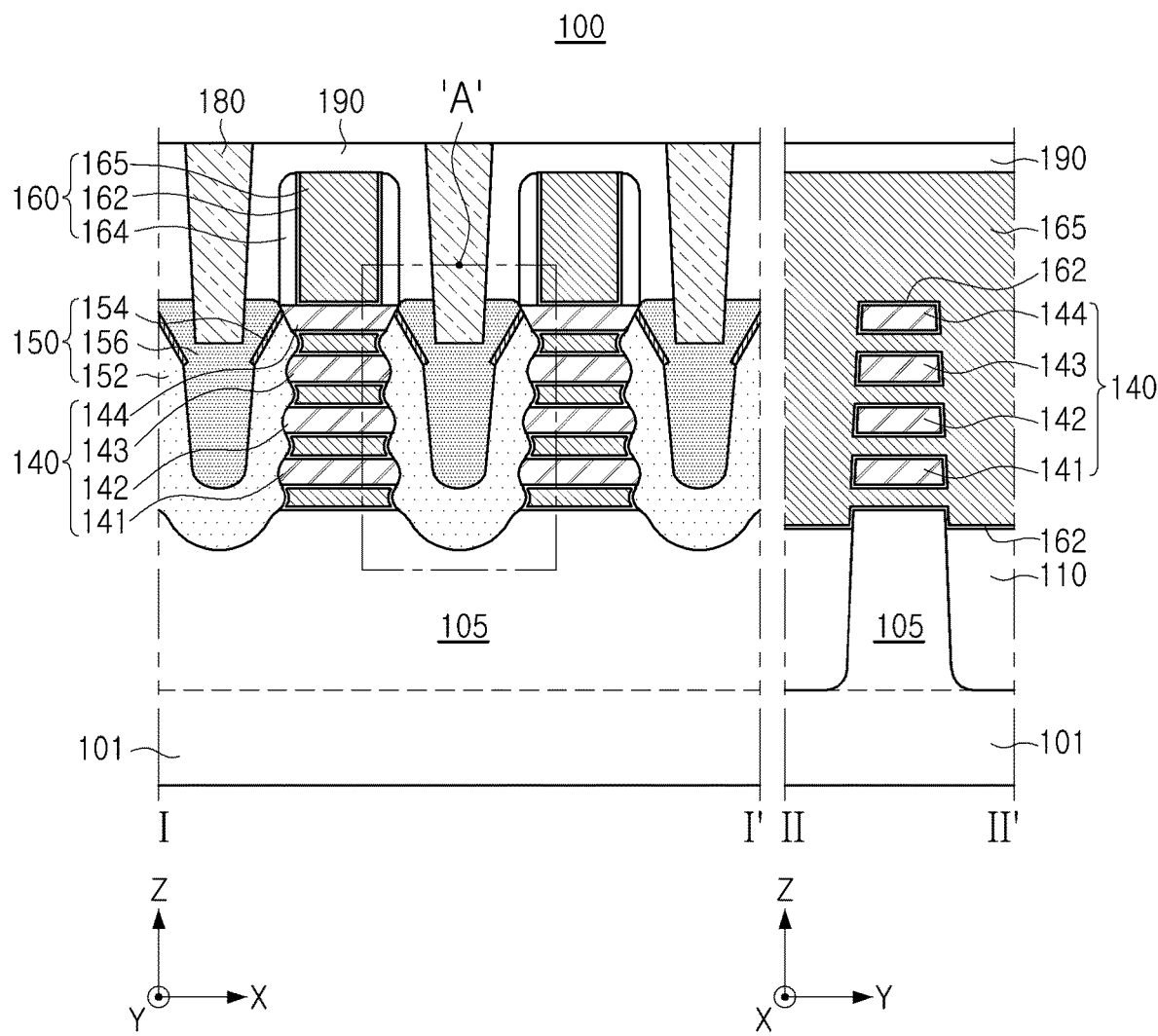
FIG. 2 is a cross-sectional view illustrating a semiconductor device according to example embodiments.

FIG. 2 is a cross-sectional view illustrating a semiconductor device according to example embodiments. FIG. 2 shows cross-sections of the semiconductor device of FIG. 1 taken along cutting lines I-I' and II-II'. For convenience of explanation, only some components of the semiconductor device are illustrated in FIG. 1.

Figure 3:
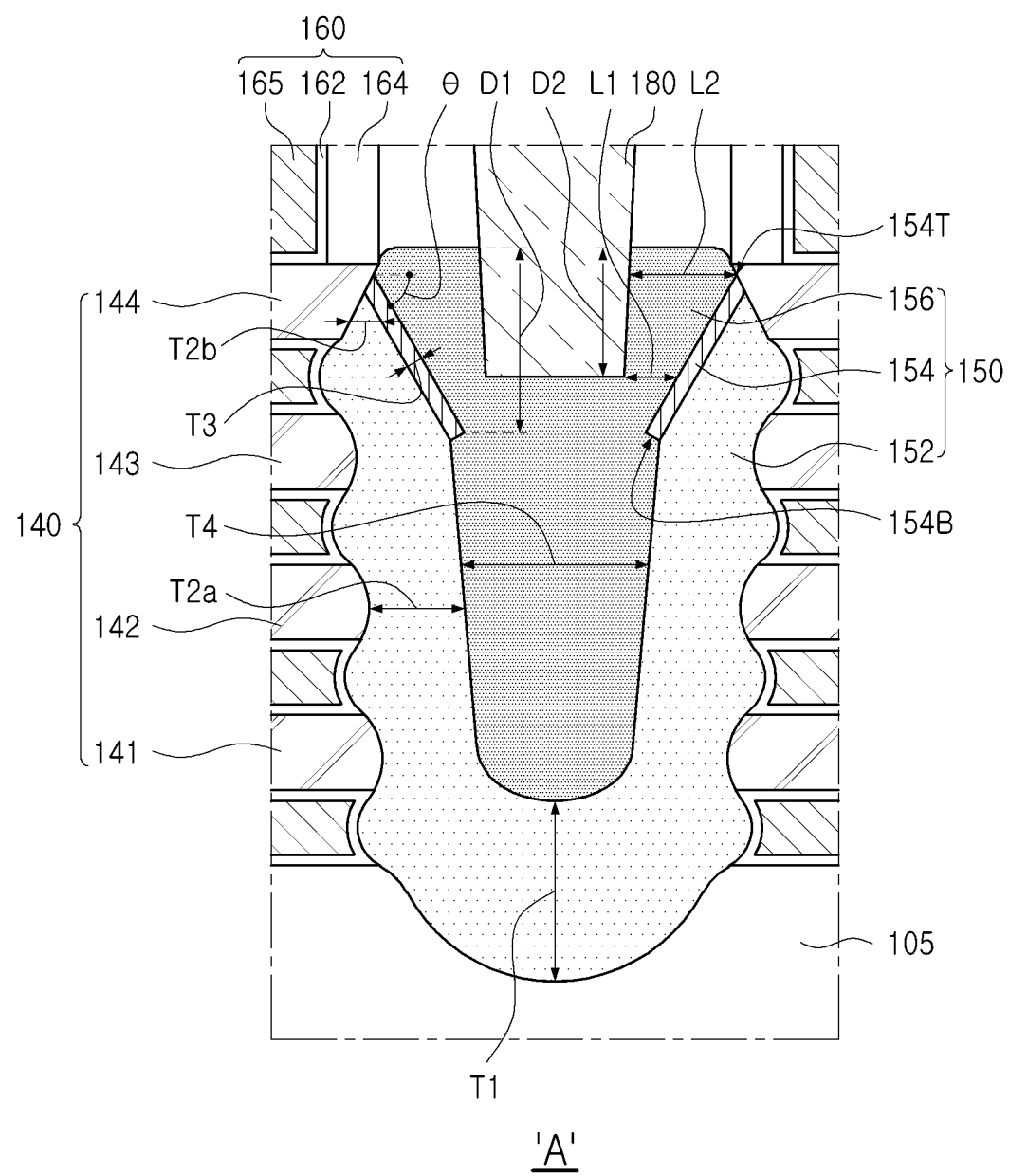
FIG. 3 is a partially enlarged view illustrating a semiconductor device according to example embodiments.

FIG. 3 is a partially enlarged view illustrating a semiconductor device according to example embodiments. FIG. 3 is an enlarged view of area 'A' of FIG. 2.

Referring to FIGS. 1 to 3, a semiconductor device 100 may include a substrate 101 including an active region 105, channel structures 140 including first to fourth channel layers 141, 142, 143 and 144 that are vertically spaced apart from each other on the active region 105, gate structures 160 extending intersecting the active region 105 and each including a gate electrode 165, source/drain regions 150 in contact with channel structures 140, and contact plugs 180 connected to the source/drain regions 150. The semiconductor device 100 may further include a device isolation layer 110, gate dielectric layers 162, gate spacer layers 164, and an interlayer insulating layer 190.

In the semiconductor device 100, the active region 105 may have a fin structure, and a gate electrode 165 may be disposed between the active region 105 and the channel structure 140, between the first to fourth channel layers 141, 142, 143 and 144 of the channel structure 140, and on the channel structure 140. Accordingly, the semiconductor device 100 may include transistors having a multi-bridge channel FET (MBCFET™) structure, which is a gate-all-around field effect transistor.

The substrate 101 may have an upper surface extending in the X-direction and the Y-direction. The substrate 101 may include a semiconductor material, for example, a group IV semiconductor, a group III-V compound semiconductor, or a group II-VI compound semiconductor. For example, the group IV semiconductor may include silicon, germanium, or silicon-germanium. The substrate 101 may be provided as a bulk wafer, an epitaxial layer, a silicon on insulator (SOI) layer, a semiconductor on insulator (SeOI) layer, or the like.

The substrate 101 may include an active region 105 disposed in an upper portion thereof. The active region 105 may be defined by the device isolation layer 110 in the substrate 101, and may extend in the first direction, for example, the X-direction. However, example embodiments are not limited thereto and the active region 105 may be a structure separate from the substrate 101 according. The active region 105 may partially protrude into the device isolation layer 110, and an upper surface of the active region 105 may be positioned on a level higher than that of an upper surface of the device isolation layer 110. The active region 105 may be formed as a part of the substrate 101, or may include an epitaxial layer grown from the substrate 101. On both sides of the gate structure 160, the active region 105 may be partially recessed to form recessed regions, and source/drain regions 150 may be disposed in the recess regions.

In example embodiments, the active region 105 may or may not include a well region including impurities. For example, for a P-type transistor (pFET), the well region may include N-type impurities such as phosphorus (P), arsenic (As), or antimony (Sb), and for an N-type transistor (nFET), the well region may include P-type impurities such as boron (B), gallium (Ga), or indium (In). The well region may be located, for example, at a predetermined depth from the upper surface of the active region 105.

The device isolation layer 110 may define an active region 105 in the substrate 101. The device isolation layer 110 may be formed by, for example, a shallow trench isolation (STI) process. The device isolation layer 110 may expose an upper surface of the active region 105, or partially expose the upper surface of the active region 105. In some example embodiments, the device isolation layer 110 may have a curved upper surface to have a higher level as it approaches the active region 105. The device isolation layer 110 may be formed of an insulating material. The device isolation layer 110 may be, for example, an oxide, a nitride, or a combination thereof.

The gate structures 160 may be disposed on the active region 105 and the channel structures 140, and may extend in the second direction, for example, the Y-direction to intersect the active region 105 and the channel structures 140. A functional channel region of the transistors may be formed in the active region 105 and/or the channel structures 140 intersecting the gate electrodes 165 of the gate structures 160. Each of the gate structures 160 may include a gate electrode 165, gate dielectric layers 162 between the gate electrode 165 and the first to fourth channel layers 141, 142, 143 and 144, and gate spacer layers 164 on sides of the gate electrode 165. In example embodiments, each of the gate structures 160 may further include a capping layer on the upper surface of the gate electrode 165. In some example embodiments, a portion of the interlayer insulating layer 190 on the gate structure 160 may be referred to as a gate capping layer.

The gate dielectric layers 162 may be disposed between the active region 105 and the gate electrode 165 and between the channel structure 140 and the gate electrode 165, and may be disposed to cover at least a portion of the surfaces of the gate electrode 165. For example, the gate dielectric layers 162 may be disposed to surround all surfaces except the upper surface of the gate electrode 165. The gate dielectric layers 162 may extend between the gate electrode 165 and the gate spacer layers 164, but example embodiments are not limited thereto. The gate dielectric layers 162 may include oxide, nitride, or a high-K material. The high-κ material may refer to a dielectric material having a higher dielectric constant than that of a silicon oxide layer ($SiO_2$). The high-κ material may refer to a dielectric material having a higher dielectric constant than that of a silicon oxide layer ($SiO_2$). The high dielectric constant material may be one of, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide (ZrSixOy), hafnium oxide ($HfO_2$), hafnium silicon oxide (HfSixOy), lanthanum oxide ($La_2O_3$), lanthanum aluminum oxide (LaAlxOy), lanthanum hafnium oxide (LaHfxOy), hafnium aluminum oxide (HfAlxOy), and praseodymium oxide ($Pr_2O_3$). In some example embodiments, the gate dielectric layer 162 may be formed of a multilayer film.

The gate electrode 165 may be disposed on the active region 105 to fill spaces between the first to fourth channel layers 141, 142, 143, and 144 and extend onto the channel structure 140. The gate electrode 165 may be spaced apart from the first to fourth channel layers 141, 142, 143, and 144 by the gate dielectric layers 162. The gate electrode 165 may include a conductive material, and for example, may include a metal nitride such as a titanium nitride film (TiN), a tantalum nitride film (TaN), or a tungsten nitride film (WN), and/or a metallic material such as aluminum (Al), tungsten (W), or molybdenum (Mo) or a semiconductor material such as doped polysilicon. According to example embodiments, the gate electrode 165 may be formed of two or more multilayer structures.

The gate spacer layers 164 may be disposed on both sides of the gate electrode 165 on the channel structure 140. The gate spacer layers 164 may insulate the source/drain regions 150 from the gate electrode 165. The gate spacer layers 164 may have a multilayer structure according to example embodiments. The gate spacer layers 164 may be formed of oxide, nitride, and oxynitride, and in detail, a low-K film.

The channel structures 140 may be disposed on the active region 105 in regions where the active region 105 intersects the gate structures 160. Each of the channel structures 140 may include first to fourth channel layers 141, 142, 143, and 144 which are a plurality of channel layers spaced apart from each other in the Z-direction. The first to fourth channel layers 141, 142, 143, and 144 may be sequentially disposed from the active region 105. The channel structures 140 may be connected to the source/drain regions 150. The channel structures 140 may have the same or similar width as the gate structures 160 in the X-direction, and may have a width equal to or less than that of the active region 105 in the Y-direction. In a cross-section in the Y-direction, a lower channel layer among the first to fourth channel layers 141, 142, 143, and 144 may have a width equal to or greater than that of the upper channel layer.

The number and shape of the channel layers constituting one channel structure 140 may be variously changed in example embodiments. As illustrated in FIG. 2, the first to third channel layers 141, 142 and 143 have a convex shape to the outside of the side in the X-direction, and the uppermost fourth channel layer 144 may have side surfaces that are inclined so that a width decreases toward the active region 105. The channel structure 140 may have a shape in which a width in the X-direction increases as the channel layer is closer to the active region 105. At least one of the first to fourth channel layers 141, 142, 143, and 144 may have a reduced width such that side surfaces are positioned below the gate structures 160 in the X-direction. However, in example embodiments, the shapes and relative widths of side surfaces of the first to fourth channel layers 141, 142, 143, and 144 may be variously changed and are not limited to those illustrated in FIG. 2. For example, in some example embodiments, the first to fourth channel layers 141, 142, 143, and 144 may have side surfaces extending vertically in the Z-direction.

The channel structures 140 may be formed of a semiconductor material, and may include, for example, at least one of silicon (Si), silicon germanium (SiGe), or germanium (Ge). The channel structures 140 may be formed of, for example, the same material as the active region 105. In some example embodiments, the channel structures 140 may include an impurity region positioned in a region adjacent to the source/drain regions 150.

The source/drain regions 150 may be disposed in recess regions partially recessed from the upper portion of the active region 105 at both sides of the gate structure 160. The source/drain region 150 may be disposed to cover side surfaces in the X-direction of each of the first to fourth channel layers 141, 142, 143, and 144 of the channel structures 140. The upper surfaces of the source/drain regions 150 may be located at the same or similar height as the bottom surfaces of the gate electrodes 165 on the channel structures 140, and the height may be variously changed in example embodiments. The source/drain regions 150 may include a semiconductor material, for example, at least one of silicon (Si) or germanium (Ge), and may further include impurities. Each of the source/drain regions 150 may include a first semiconductor layer 152, a second semiconductor layer 156, and diffusion barrier layers 154 interposed between portions of the first semiconductor layer 152 and portions of the second semiconductor layer 156.

The first semiconductor layer 152 may cover side surfaces in the X-direction of each of the first to fourth channel layers 141, 142, 143, 144, and may cover side surfaces in the X-direction of the gate structures 160 under the channel structures. The first semiconductor layer 152 may cover the inner side surface and the bottom surface of the recess region in which the source/drain region 150 is disposed, and may extend as one layer within one source/drain region 150. The first semiconductor layer 152 may have a side surface that convexly protrudes toward the gate structures 160 below each of the channel structures 140, and accordingly, may have curvature on the side surface.

As illustrated in FIG. 3, thicknesses T2$a$ and T2$b$ of the first semiconductor layer 152 on the side surfaces of the channel structure 140 may be less than a thickness T1 of the first semiconductor layer 152 on the bottom surface of the recess region. The upper thickness T2$b$ on the side surface of the uppermost channel layer, the fourth channel layer 144, may be less than the lower thickness T2$a$ on the side surface of the lower channel layer, for example, the second channel layer 142. The region having the upper thickness T2$b$ may be a region in which the diffusion barrier layer 154 is between the first semiconductor layer 152 and the second semiconductor layer 156, and the region having the lower thickness T2$a$ may be a region in which the first semiconductor layer 152 does not contact the diffusion barrier layer 154 and the first semiconductor layer 152 is in direct contact with the second semiconductor layer 156. For example, each of the thicknesses T2$a$ and T2$b$ may range from about 1 nm to about 20 nm.

The first semiconductor layer 152 may be grown to a relatively thin thickness on the side surface of the fourth channel layer 144 due to the gate spacer layers 164 of the gate structures 160 during manufacturing, and may be formed to have a facet formed along a crystal plane. For example, when the upper surface of the substrate 101 or the active region 105 is a {100} plane, the first semiconductor layer 152 may have a {111} facet including a {100} plane at its upper end or upper portion.

The diffusion barrier layers 154 may be disposed on the first semiconductor layer 152 in an upper region of the first semiconductor layer 152, for example, in regions including upper ends. The diffusion barrier layers 154 may be disposed in a plurality, for example, two for each source/drain region 150, and may be spaced apart from each other in the X-direction. The diffusion barrier layers 154 may be symmetrically disposed with respect to the center of the source/drain region 150 in the X-direction. The diffusion barrier layers 154 may be semiconductor layers containing carbon (C) in a relatively high concentration in addition to a semiconductor material such as silicon (Si) and/or germanium (Ge). In the diffusion barrier layers 154, the concentration of carbon (C) may range from about $1 \times 10^{18}/cm^3$ to about $5 \times 10^{21}/cm^3$. For example, if the concentration of carbon is lower than the above range, the diffusion prevention function for dopants to be described later may not be sufficient, and if the concentration of carbon is higher than the above range, the resistance of the source/drain region 150 may increase.

As illustrated in FIG. 3, each of the diffusion barrier layers 154 may be disposed on a facet of the first semiconductor layer 152 to extend along the facet. For example, the diffusion barrier layer 154 may extend along a {111} crystal plane. The thickness T3 of the diffusion barrier layer 154 may be in a range of about 0.1 nm to about 5.0 nm. The diffusion barrier layer 154 may form a predetermined angle θ with the X-direction, and may extend with an inclination at an angle between the X-direction and the Z-direction. The angle θ may be, for example, 54.7°, but may be changed according to the type of crystal plane of the substrate 101.

The upper end 154T of the diffusion barrier layer 154 may contact the fourth channel layer 144. However, in some example embodiments, the entire side surface of the fourth channel layer 144 may be covered with the first semiconductor layer 152. In this case, the upper end 154T of the diffusion barrier layer 154 may be adjacent to the fourth channel layer 144 but spaced apart from the fourth channel layer 144 by the first semiconductor layer 152. The lower end 154B of the diffusion barrier layer 154 may be positioned on a level higher than that of at least one channel layer. In detail, the lower end 154B of the diffusion barrier layer 154 may be positioned at a level higher than the level of the upper surface of the first channel layer 141. As shown, the lower end 154B of the diffusion barrier layer 154 may be located at a level higher than the level of the upper surface of the second channel layer 142, but example embodiments are not limited thereto. The lower end 154B of the diffusion barrier layer 154 may be located at a level lower than the level of the lower surface of the fourth channel layer 144, for example, at a level between the lower surface and the upper surface of the third channel layer 143, but example embodiments are not limited thereto.

The lower end 154B of the diffusion barrier layer 154 may be located at a first depth D1 from the upper surface of the source/drain region 150. As shown, the first depth D1 may be greater than the second depth D2 of the contact plug 180. The first depth D1 may be, for example, in a range of about 10 nm to about 30 nm. A length in the extension direction of the diffusion barrier layer 154 may be in a range of about 15 nm to about 35 nm. The lower end 154B of the diffusion barrier layer 154 may be spaced apart from the contact plug 180 by a first length L1 in the X-direction, and the upper end 154T may be spaced apart from the contact plug 180 by a second length L2 greater than the first length L1.

The second semiconductor layer 156 may cover the first semiconductor layer 152 and the diffusion barrier layers 154, and fill the recess region. The second semiconductor layer 156 may be surrounded by the first semiconductor layer 152 and the diffusion barrier layers 154 in a region except for the upper surface thereof. The width or thickness T4 of the second semiconductor layer 156 in the X-direction, inside the first semiconductor layer 152, may be greater than the thicknesses T2a and T2b of the first semiconductor layer 152 on the side of the channel structure 140. The thickness T4 may be, for example, in the range of about 10 nm to 100 nm.

The second semiconductor layer 156 may include the same material as the first semiconductor layer 152, but a composition and/or doping concentration may be different from that of the first semiconductor layer 152. When the semiconductor device 100 is a pFET, the source/drain region 150 may include silicon germanium (SiGe), and the germanium (Ge) concentration of the second semiconductor layer 156 may be higher than the germanium (Ge) concentration of the first semiconductor layer 152. For example, the germanium (Ge) concentration of the first semiconductor layer 152 is in the range of about 1 at % to about 15 at %, and the concentration of germanium (Ge) in the second semiconductor layer 156 may be in a range of about 20 at % to about 100 at %. Also, in the second semiconductor layer 156, a doping concentration of dopants, for example, impurities may be higher than that of the first semiconductor layer 152. When the semiconductor device 100 is a pFET, the impurities may be at least one of boron (B), gallium (Ga), or indium (In), and in the case of an nFET, the impurities may be at least one of phosphorus (P), arsenic (As), or antimony (Sb). For example, the boron (B) concentration of the first semiconductor layer 152 ranges from about $1 \times 10^{16}/cm^3$ to about $1 \times 10^{26}/cm^3$. The boron (B) concentration of the second semiconductor layer 156 may be in the range of about $1 \times 10^{19}/cm^3$ to about $2 \times 10^{22}/cm^3$.

Because the diffusion barrier layers 154 include carbon (C), diffusion of dopants from the second semiconductor layer 156 having a relatively high concentration of impurities into the channel structure 140 may be prevented. For example, boron (B), a dopant, may be diffused through an interstitial site in the semiconductor material constituting the source/drain region 150, and carbon (C) of the diffusion barrier layers 154 may be bonded to the interstitial site to prevent such diffusion. Accordingly, in the channel layers in an upper portion of the channel structure 140 in which the first semiconductor layer 152 has a relatively thin thickness, a short channel phenomenon caused by diffusion of the dopant may be prevented.

The interlayer insulating layer 190 may cover the source/drain regions 150 and the gate structure 160, and may be disposed to cover the device isolation layer 110. The interlayer insulating layer 190 may include at least one of an oxide, a nitride, or an oxynitride, and for example, may include a low-κ material. In some example embodiments, the interlayer insulating layer 190 may include a plurality of insulating layers.

The contact plugs 180 may pass through the interlayer insulating layer 190 to be connected to the source/drain regions 150, and may transmit an electrical signal to the source/drain regions 150. The contact plugs 180 may have inclined side surfaces in which a lower width is narrower than an upper width according to an aspect ratio, but example embodiments are not limited thereto. The contact plugs 180 may extend from an upper portion, for example, lower than a lower surface of the fourth channel layer 144 of the uppermost portion of the channel structure 140, but example embodiments are not limited thereto. The contact plugs 180 may contact the second semiconductor layers 156 of the source/drain regions 150, and the diffusion barrier layers 154 may be spaced apart from each other. In some example embodiments, the contact plugs 180 do not recess the source/drain regions 150, and the source/drain regions 150 may be disposed to be in contact with the upper surface thereof.

Each of the contact plugs 180 may include a metal silicide layer positioned at a lower portion including a lower surface, and a barrier layer forming side surfaces of the contact plug 180 and extending on an upper surface of the metal silicide layer may be further included. The barrier layer may include, for example, a metal nitride such as a titanium nitride layer (TiN), a tantalum nitride layer (TaN), or a tungsten nitride layer (WN). The contact plugs 180 may include, for example, a metal material such as aluminum (Al), tungsten (W), or molybdenum (Mo). In example embodiments, the number and arrangement of conductive layers constituting the contact plugs 180 may be variously changed.

An interconnection structure such as a contact plug may be further disposed on the gate electrode 165, and an interconnection structure connected to the contact plugs 180 may be further disposed on the contact plugs 180.

In the description of example embodiments below, descriptions overlapping with those described above with reference to FIGS. 1 to 3 will be omitted.

Figure 4:
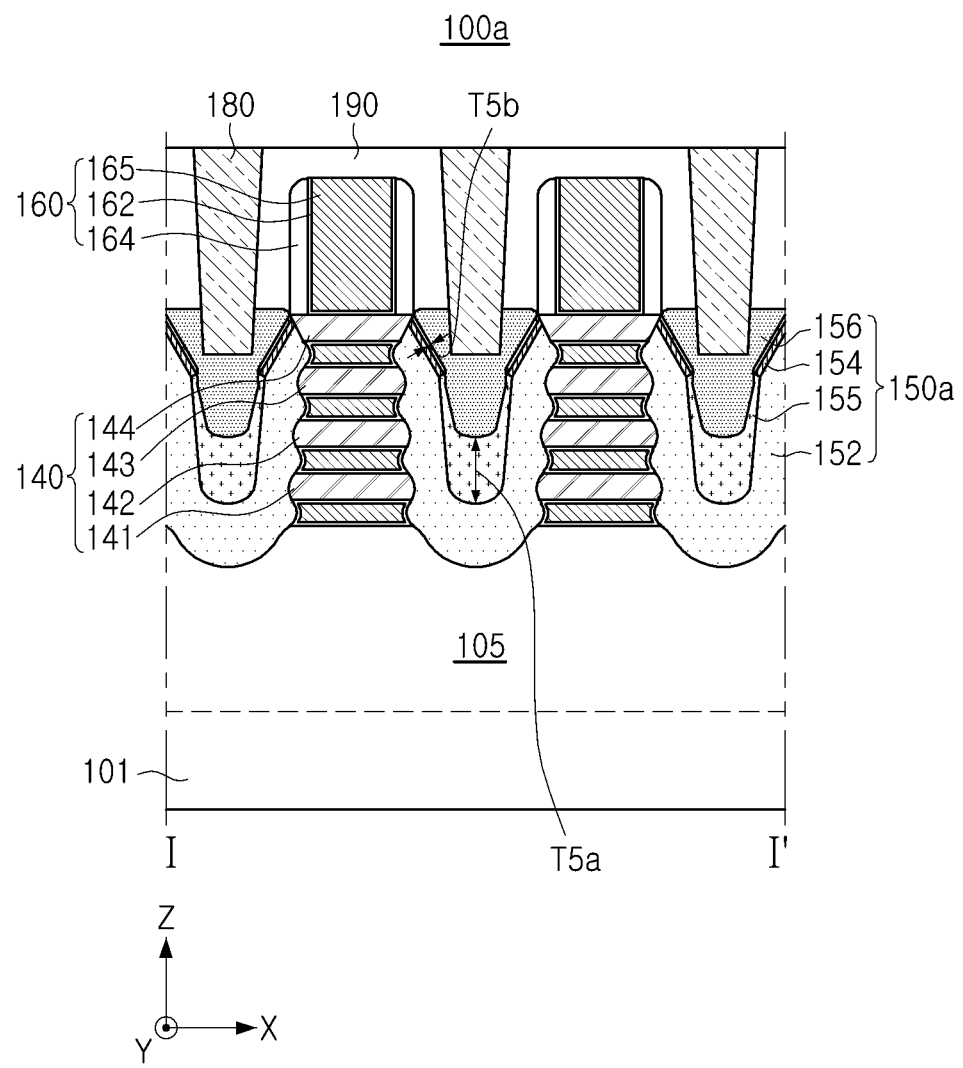
FIGS. 4 to 6 are schematic cross-sectional views illustrating semiconductor devices according to example embodiments.
Figure 5:
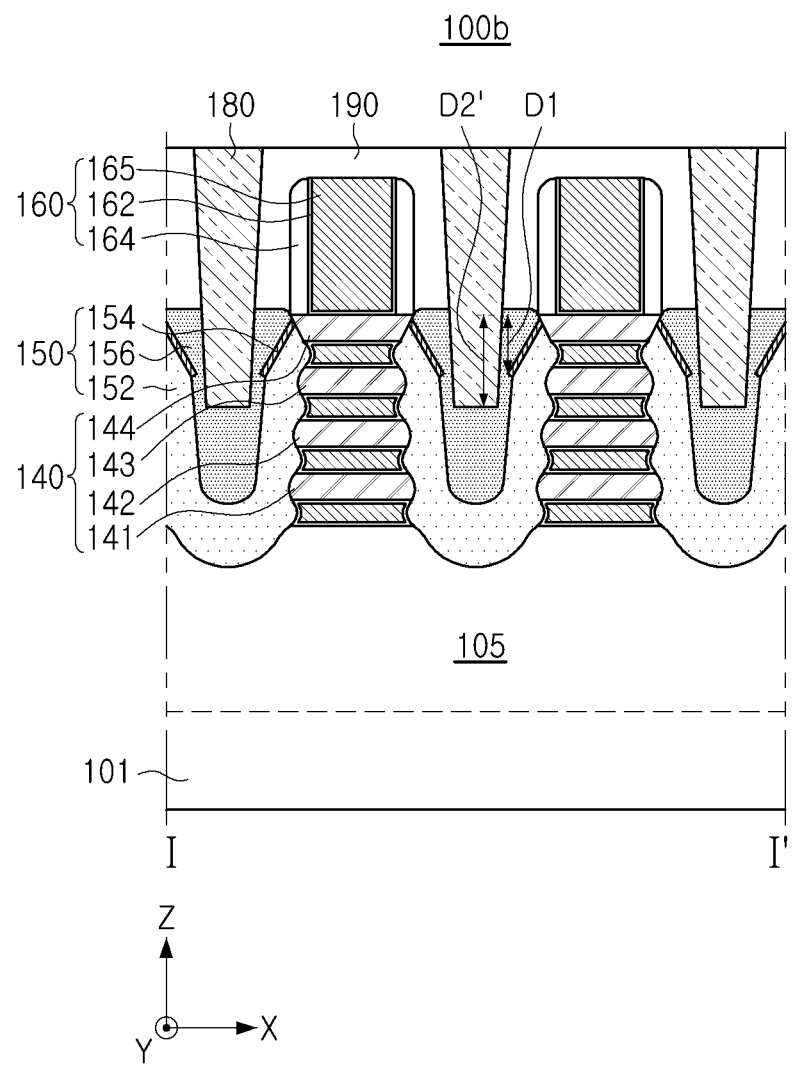
Figure 6:
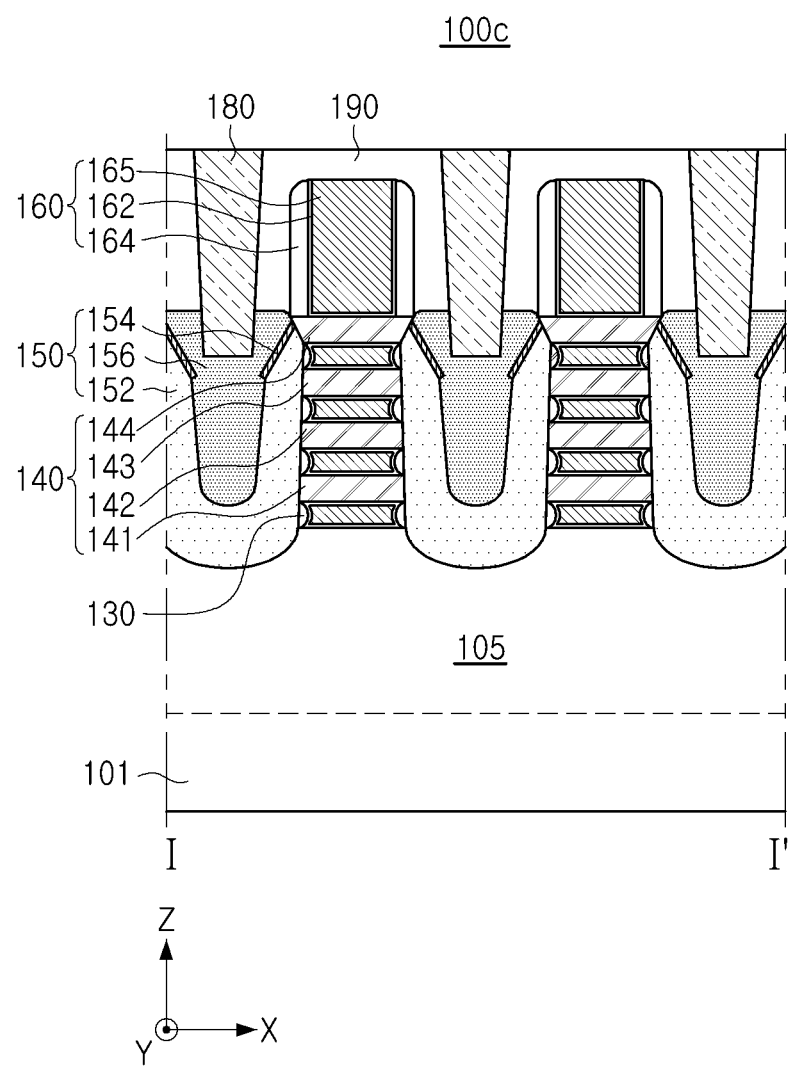

FIGS. 4 to 6 are schematic cross-sectional views illustrating semiconductor devices according to example embodiments. FIGS. 4 to 6 respectively show cross-sections taken along the cutting line I-I' of FIG. 1.

Referring to FIG. 4, in the semiconductor device 100a, each of the source/drain regions 150a includes a second semiconductor layer 156, the diffusion barrier layers 154, and the second semiconductor layer 156 and may further include a third semiconductor layer 155.

The third semiconductor layer 155 may be disposed on the first semiconductor layer 152 and the diffusion barrier layers 154. The thickness T5a of the third semiconductor layer 155 in the Z-direction in a lower region may be greater than the thickness T5b in an upper region including a region on the diffusion barrier layers 154. Accordingly, the third semiconductor layer 155 may be mainly disposed in a lower portion of the source/drain region 150a.

The third semiconductor layer 155 may include the same material as the first and second semiconductor layers 152 and 156, but have a composition and/or doping concentration different from the first and second semiconductor layers 152 and 156. For example, the doping concentration of the third semiconductor layer 155 may be higher than that of the first semiconductor layer 152 and lower than the doping concentration of the second semiconductor layer 156. For example, the germanium (Ge) concentration of the third semiconductor layer 155 may be higher than the germanium (Ge) concentration of the first semiconductor layer 152 and lower than the germanium (Ge) concentration of the second semiconductor layer 156.

As such, in example embodiments, the number and arrangement of the semiconductor layers constituting the source/drain regions 150a may be variously changed.

Referring to FIG. 5, in the semiconductor device 100b, the contact plugs 180 may extend into the source/drain regions 150 farther than the diffusion barrier layers 154.

The depth D2' from the upper surfaces of the source/drain regions 150 to the bottom surfaces of the contact plugs 180 may be greater than the depth D1 from the upper surfaces of the source/drain regions 150 to the bottoms of the diffusion barrier layers 154. The contact plugs 180 may be disposed to contact the second semiconductor layers 156. As such, in example embodiments, the depth of the contact plugs 180 may be variously changed.

Referring to FIG. 6, the semiconductor device 100c may further include inner spacer layers 130 disposed on both side surfaces of the gate structures 160 in the X-direction under the fourth channel layers 144.

The inner spacer layers 130 may extend in parallel with the gate electrodes 165 and the gate dielectric layers 162 between the first to fourth channel layers 141, 142, 143, and 144 in the Z-direction. The gate electrodes 165 may be stably spaced apart from the source/drain regions 150 by the inner spacer layers 130 to be electrically isolated from each other. The inner spacer layers 130 may have a shape in which side surfaces facing the gate electrodes 165 are convexly rounded inward toward the gate electrodes 165, but example embodiments are not limited thereto. The inner spacer layers 130 may be formed of oxide, nitride, or oxynitride, and in detail, a low-K film.

In some example embodiments, the inner spacer layers 130 may be applied only to some of the channel structures 140 of the semiconductor device 100c. For example, in an nFET, the inner spacer layers 130 may be applied, and in a pFET, the inner spacer layer 130 may be omitted to improve the crystallinity of silicon germanium (SiGe) in the source/drain regions 150.

Figure 7:
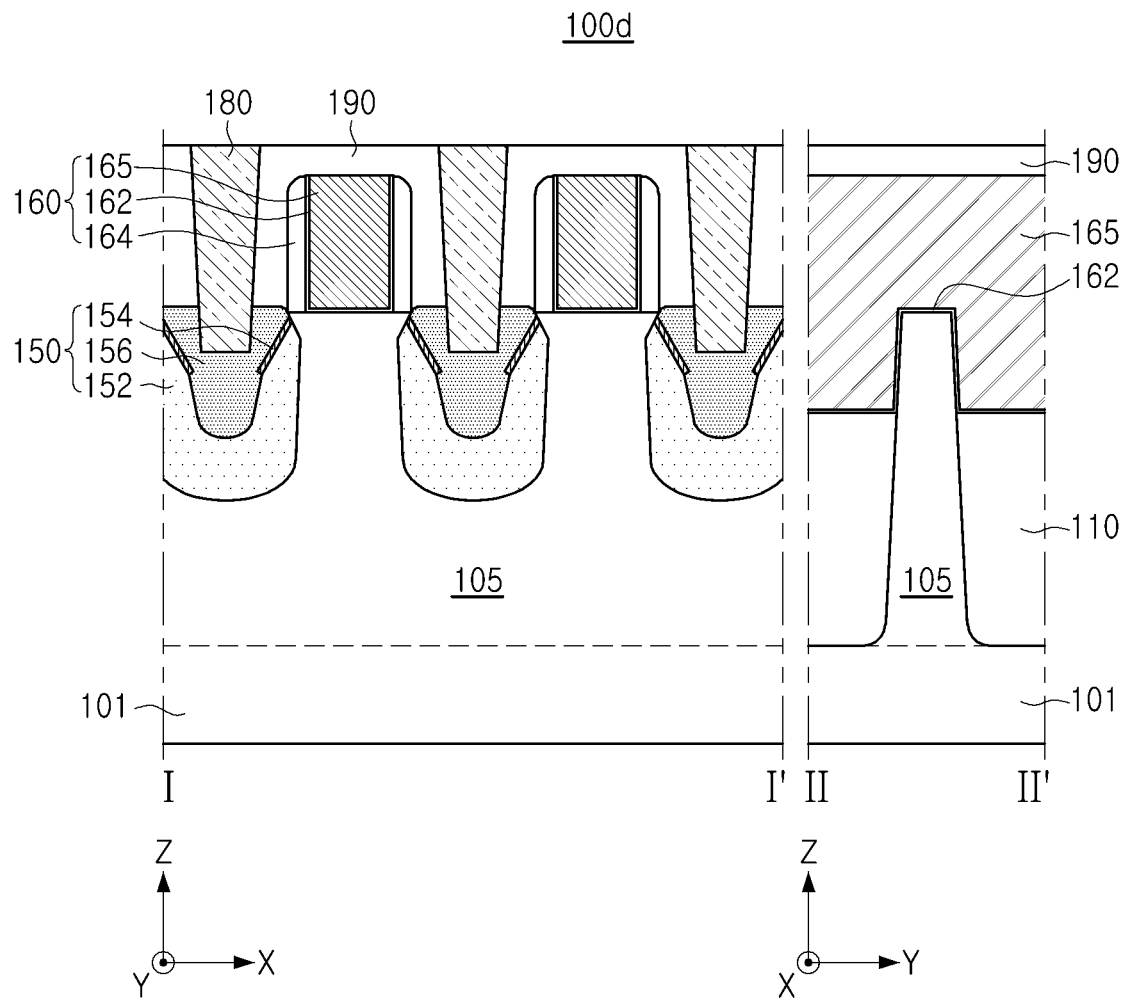
FIG. 7 is a cross-sectional view illustrating a semiconductor device according to example embodiments.

FIG. 7 is a cross-sectional view illustrating a semiconductor device according to example embodiments.

Referring to FIG. 7, the semiconductor device 100d may not include the channel structures 140, in contrast to example embodiments discussed above with respect to FIGS. 1 to 3, and accordingly, the disposition of the gate structures 160 may be different from example embodiments described above. The semiconductor device 100d may include FinFETs that do not include a separate channel layer.

In the semiconductor device 100d, the channel region of the transistors may be positioned within the active region 105 of the fin structure, which is the active structure. Also, separate channel layers may not be interposed in the gate electrodes 165. Accordingly, in the source/drain regions 150, the first semiconductor layers 152 may not have curvatures corresponding to the side surfaces of the gate structure 160 and the channel layers. However, for other descriptions of the gate electrodes 165 and the source/drain regions 150, the descriptions of example embodiments with respect to FIGS. 1 to 3 may be equally applied. Such a semiconductor device 100d may be additionally disposed in one region of the semiconductor device of other example embodiments.

FIGS. 8A to 8I are diagrams illustrating a process sequence to describe a method of manufacturing a semiconductor device according to example embodiments. An example embodiment of a manufacturing method for manufacturing the semiconductor device of FIG. 2 will be described with reference to FIGS. 8A to 8I.

Figure 8A:
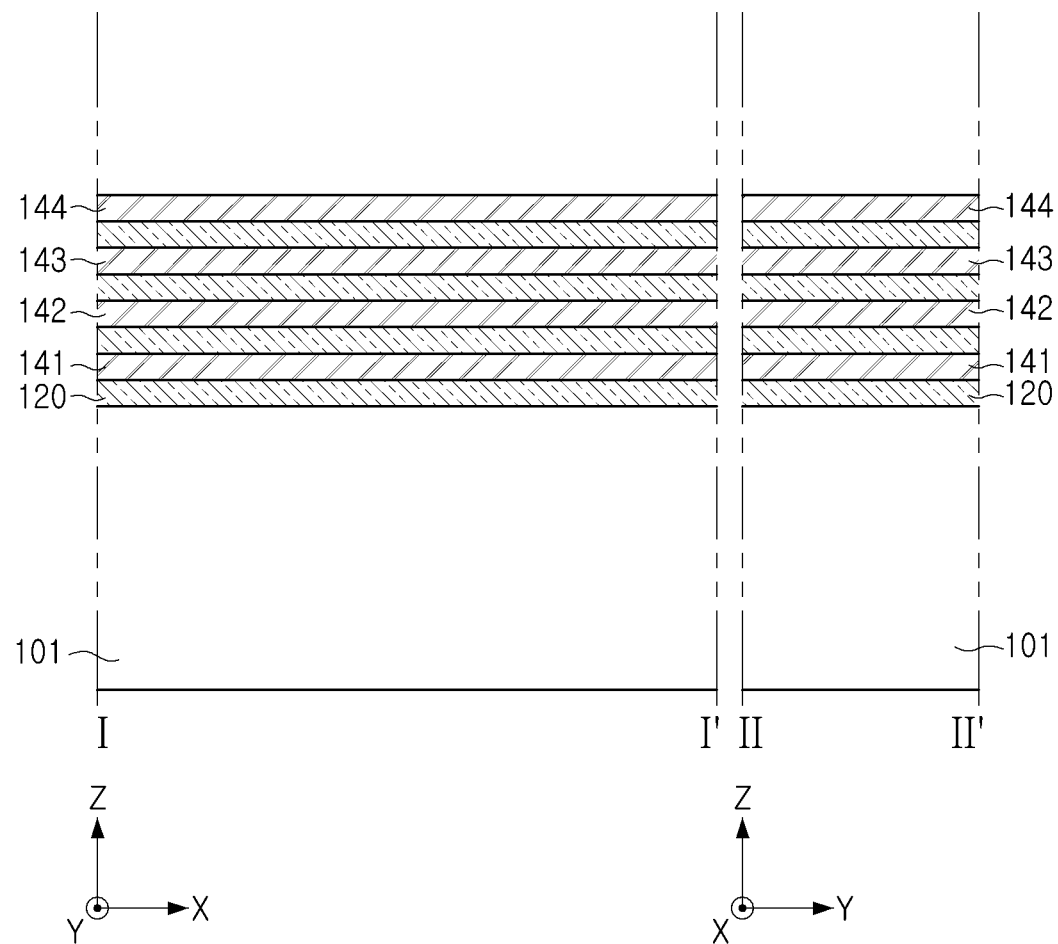
FIGS. 8A, 8B, 8C, 8D, 8E, 8F, 8G, 8H and 8I are diagrams illustrating a process sequence to describe a method of manufacturing a semiconductor device according to example embodiments.

Referring to FIG. 8A, the sacrificial layers 120 and the first to fourth channel layers 141, 142, 143, and 144 may be alternately stacked on the substrate 101.

The sacrificial layers 120 may be replaced by the gate dielectric layers 162 and the gate electrodes 165 under the fourth channel layer 144 through a subsequent process, as illustrated in FIG. 2. The sacrificial layers 120 may be formed of a material having etch selectivity with respect to the first to fourth channel layers 141, 142, 143, and 144, respectively. The first to fourth channel layers 141, 142, 143, and 144 may include a material different from that of the sacrificial layers 120. The sacrificial layers 120 and the first to fourth channel layers 141, 142, 143, and 144 may include, for example, at least one of silicon (Si), silicon germanium (SiGe), or germanium (Ge), but may include different materials, and may or may not contain impurities. For example, the sacrificial layers 120 include silicon germanium (SiGe), and the first to fourth channel layers 141, 142, 143, and 144 may include silicon (Si).

The sacrificial layers 120 and the first to fourth channel layers 141, 142, 143, and 144 may be formed by performing an epitaxial growth process from the stacked structure. Each of the sacrificial layers 120 and the first to fourth channel layers 141, 142, 143, and 144 may have a thickness in a range of about 1 nm to about 20 nm. The number of layers of the channel layers alternately stacked with the sacrificial layers 120 may be variously changed in example embodiments.

Figure 8B:
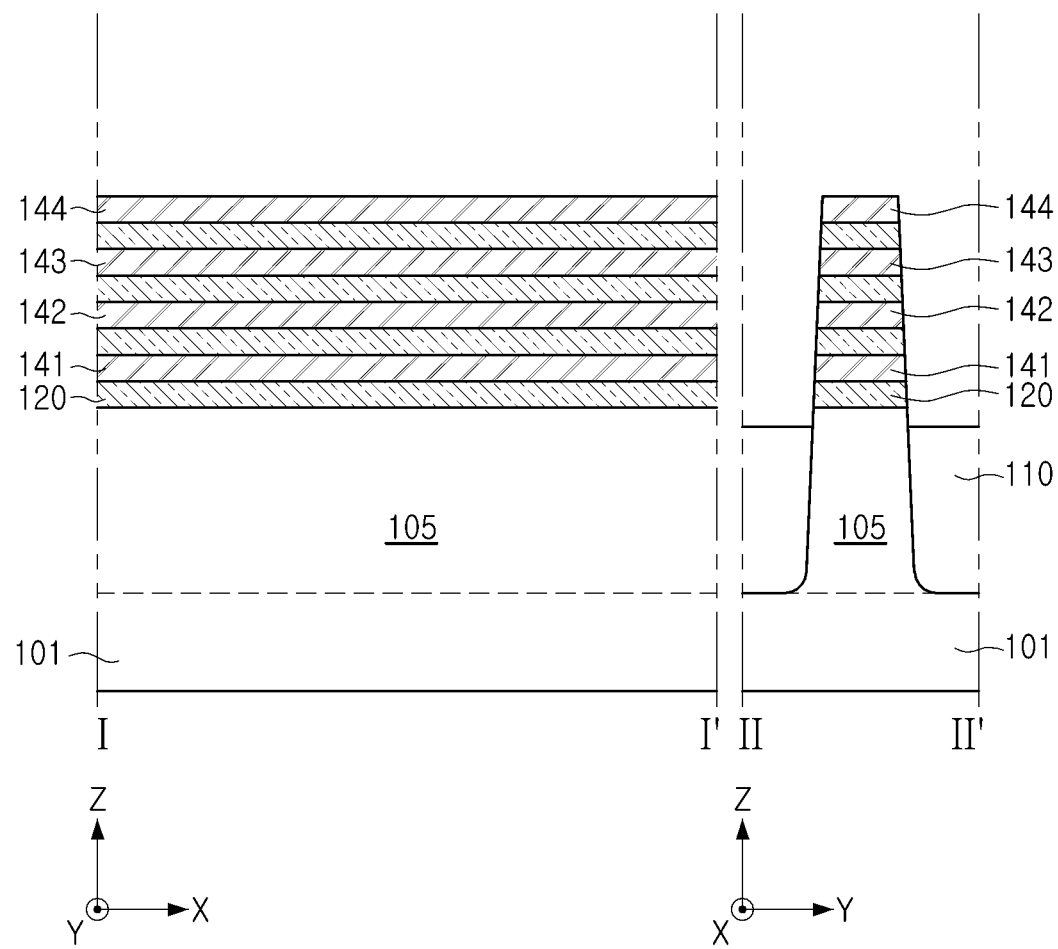

Referring to FIG. 8B, an active structure including the active region 105 by partially removing the sacrificial layers 120, the first to fourth channel layers 141, 142, 143, and 144, and a portion of the substrate 101, thereby forming the device isolation layer 110.

The active structure may include an active region 105, sacrificial layers 120, and first to fourth channel layers 141, 142, 143, and 144. The active structure may be formed in the form of a line extending in one direction, for example, the X-direction, and may be formed to be spaced apart from the adjacent active structures in the Y-direction. Side surfaces in the Y-direction of the active structure may be coplanar with each other and positioned on a straight line.

In the region from which a portion of each of the active region 105, the sacrificial layers 120, and the first to fourth channel layers 141, 142, 143, and 144 is removed, the device isolation layer 110 may be formed by partially removing an insulating material such that the active region 105 protrudes after the insulating material is filled. The upper surface of the device isolation layer 110 may be formed to be lower than the upper surface of the active region 105.

Figure 8C:
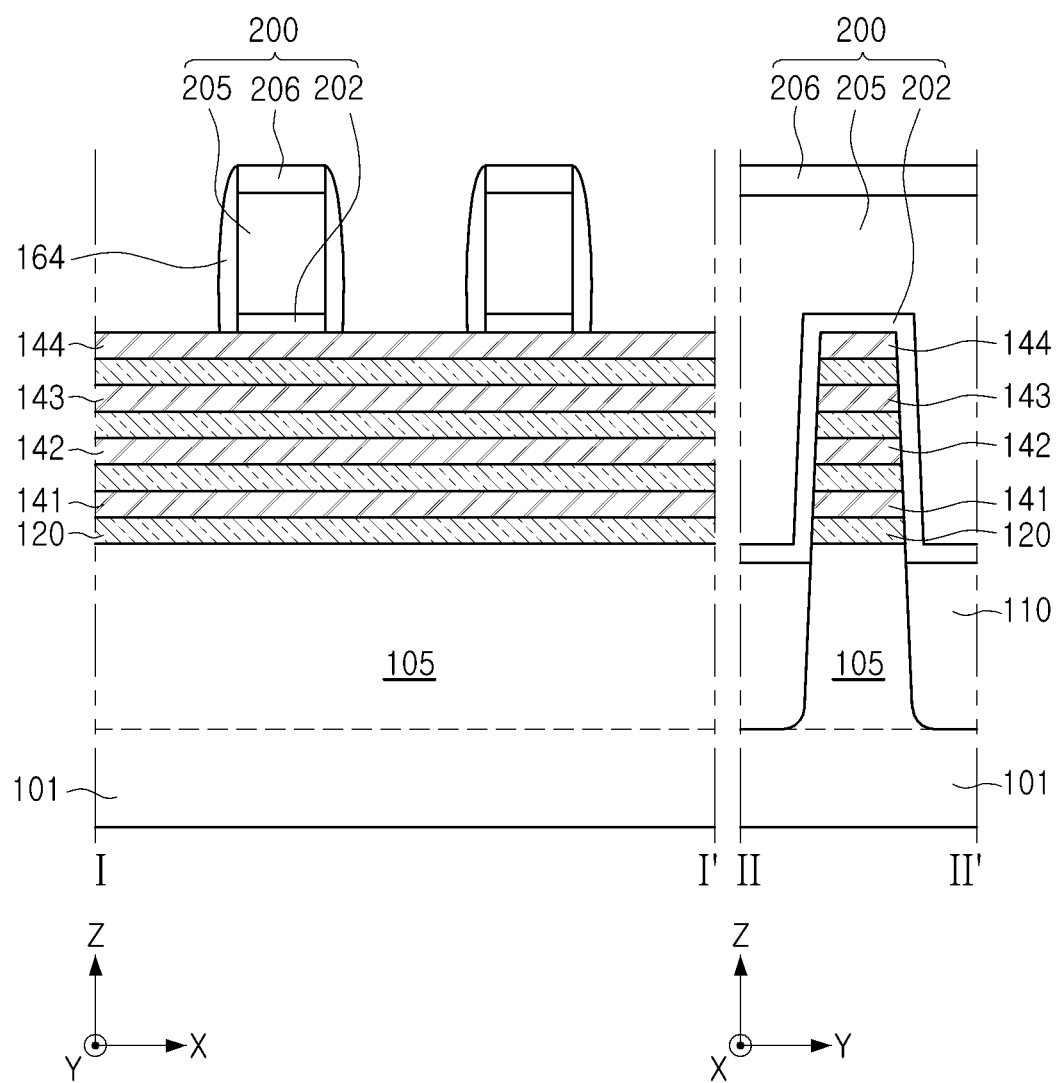

Referring to FIG. 8C, sacrificial gate structures 200 and gate spacer layers 164 may be formed on the active structure.

Each of the sacrificial gate structures 200 may be a sacrificial structure formed in a region where the gate dielectric layers 162 and the gate electrode 165 are disposed on the channel structure 140 as illustrated in FIG. 2 through a subsequent process. The sacrificial gate structures 200 may have a line shape that crosses the active structure and extends in one direction. The sacrificial gate structures 200 may extend, for example, in the Y-direction. Each of the sacrificial gate structures 200 may include first and second sacrificial gate layers 202 and 205 and a mask pattern layer 206 that are sequentially stacked. The first and second sacrificial gate layers 202 and 205 may be patterned using a mask pattern layer 206.

The first and second sacrificial gate layers 202 and 205 may be an insulating layer and a conductive layer, respectively, but example embodiments are not limited thereto, and the first and second sacrificial gate layers 202 and 205 may be formed of one layer. For example, the first sacrificial gate layer 202 may include silicon oxide, and the second sacrificial gate layer 205 may include polysilicon. The mask pattern layer 206 may include silicon oxide and/or silicon nitride.

Gate spacer layers 164 may be formed on both sidewalls of the sacrificial gate structures 200. The gate spacer layers 164 may be formed of a low-κ material, and for example, may include at least one of SiO, SiN, SiCN, SiOC, SiON, or SiOCN.

Figure 8D:
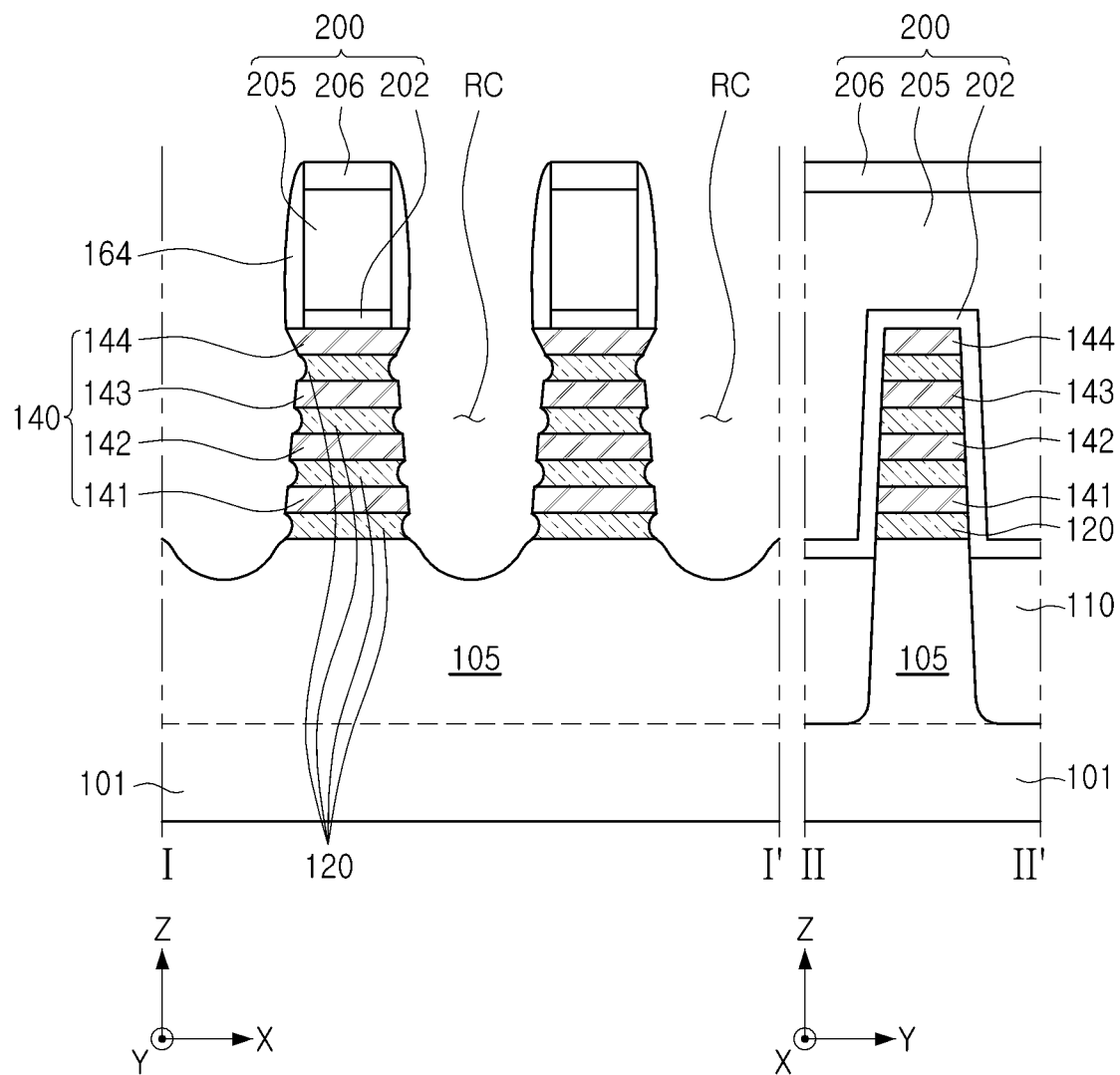

Referring to FIG. 8D, the sacrificial layers 120 and the first to fourth channel layers 141, 142, 143, and 144 exposed from the sacrificial gate structures 200 may be partially removed to form the recess regions RC, and the sacrificial layers 120 may be partially removed.

Using the sacrificial gate structures 200 and the gate spacer layers 164 as masks, a portion of the exposed sacrificial layers 120 and a portion of the first to fourth channel layers 141, 142, 143, and 144 may be removed to form the recess regions RC. Accordingly, the first to fourth channel layers 141, 142, 143, and 144 may form the channel structures 140 having a limited length in the X-direction.

The sacrificial layers 120 may be selectively etched with respect to the channel structures 140 by, for example, a wet etching process, and removed to a predetermined depth from the side surface in the X-direction. The sacrificial layers 120 may have inwardly concave side surfaces by side etching as described above. However, the specific shape of the side surfaces of the sacrificial layers 120 is not limited to that illustrated in FIG. 8D.

Figure 8E:
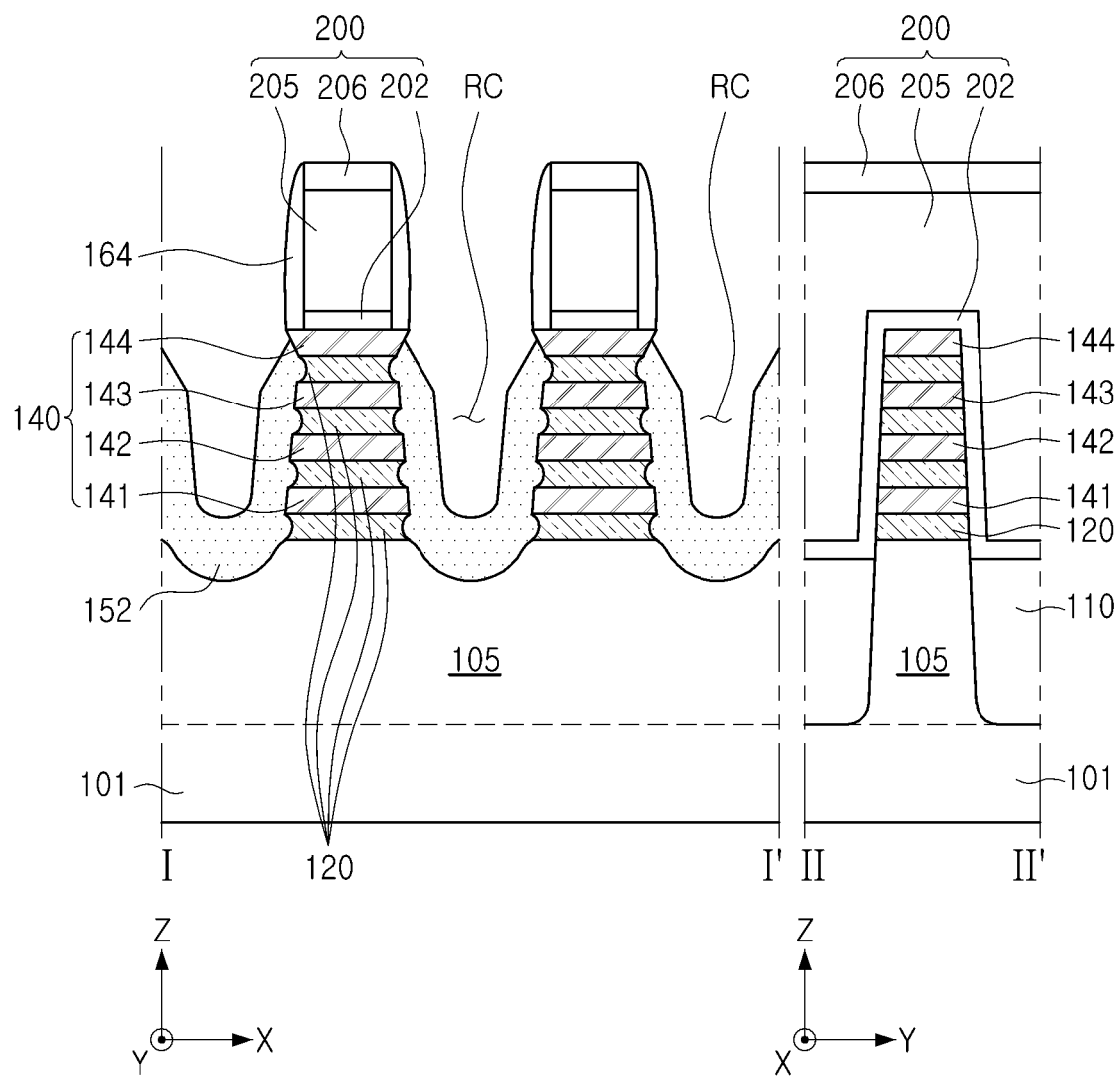

Referring to FIG. 8E, first semiconductor layers 152 of the source/drain regions 150 (refer to FIG. 2) may be formed in the recess regions RC.

Each of the first semiconductor layers 152 may be grown and formed from the active region 105 and the side surfaces of the channel structures 140 by, for example, a selective epitaxial process. The first semiconductor layers 152 may include impurities by in-situ doping or ex-situ doping. In this operation, on the side surfaces of the uppermost fourth channel layers 144 growth of the first semiconductor layers 152 may be limitedly performed by the gate spacer layers 164. Accordingly, in a region adjacent to the fourth channel layers 144, the first semiconductor layers 152 may include regions having a facet along a specific crystal plane, for example, a {111} plane. When such a facet is formed, the growth of the first semiconductor layers 152 is lowered in the facet region so that the first semiconductor layers 152 may be formed to have a relatively thin thickness in the facet region.

The semiconductor device of FIG. 6 may be manufactured by forming the inner spacer layers 130 before the formation of the first semiconductor layers 152 in this operation. The inner spacer layers 130 may include an insulating material in the region from which the sacrificial layers 120 are removed, and may be formed by removing the insulating material deposited on the outside of the channel structure 140.

Figure 8F:
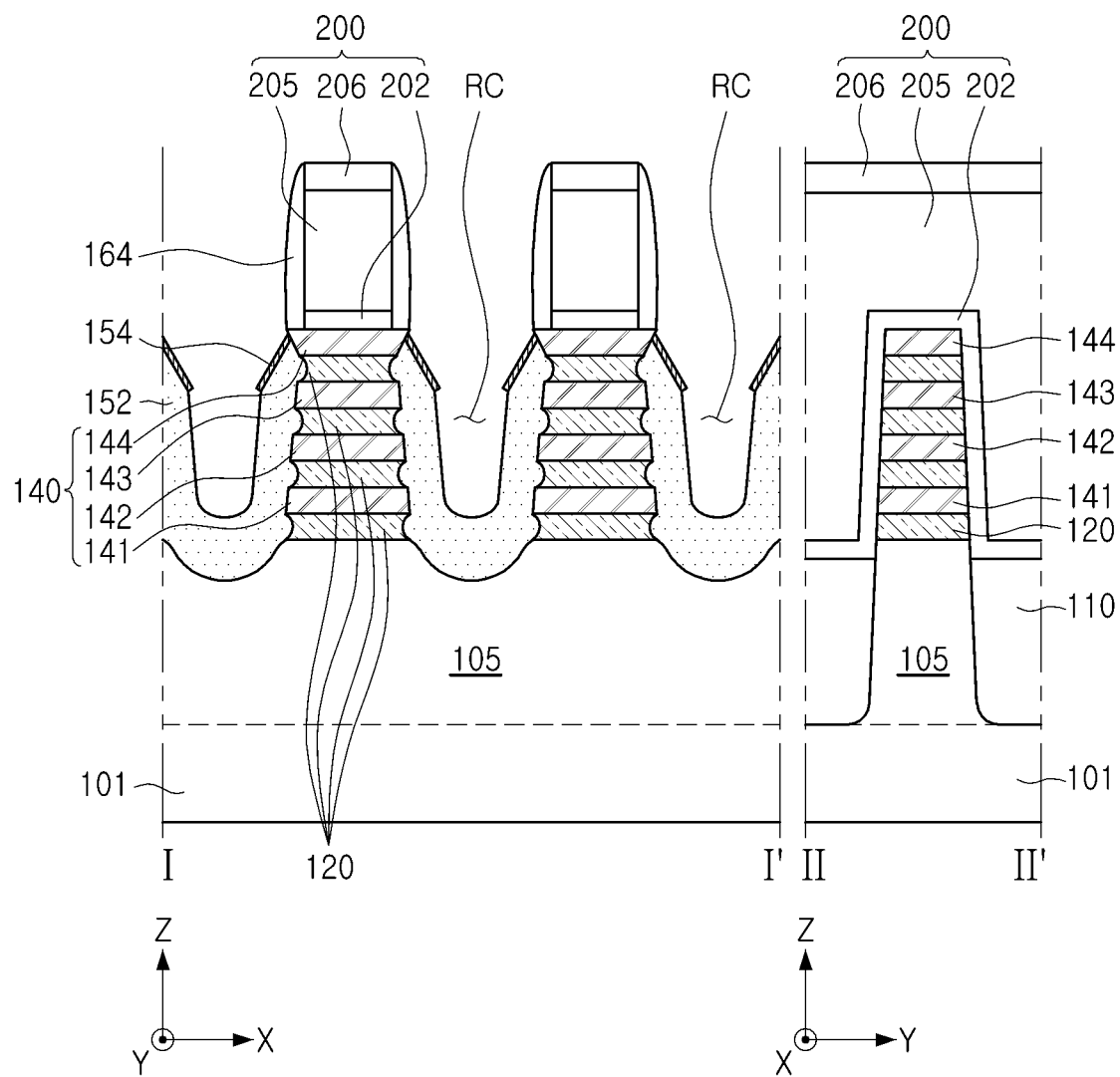

Referring to FIG. 8F, diffusion barrier layers 154 may be formed on upper regions of the first semiconductor layers 152.

The diffusion barrier layers 154 may be formed by flowing a carbon containing gas, such as monomethylsilane ($CH_3$—$SiH_3$), and may be selectively formed on the facets of the first semiconductor layers 152. The carbon-containing gas may be, for example, a source of a semiconductor material constituting the first semiconductor layer 152 and/or the second semiconductor layer 156, but example embodiments not limited thereto. For example, when using the monomethyl silane, the monomethyl silane may flow alone, or may flow with a silicon (Si) and/or germanium (Ge) source material. In the latter case, after the diffusion barrier layers 154 are formed, the flow of the monomethyl silane may be stopped and the other semiconductor source material may continue to flow such that the second semiconductor layer 156 may be formed.

On the facets of the first semiconductor layers 152, the growth rate may be relatively slow due to the characteristics of the crystal plane, and the growth of silicon (Si) or germanium (Ge) may hardly occur or the growth may be significantly reduced. In contrast, because the stacking of carbon (C) easily occurs, the carbon may be segregated to form the diffusion barrier layers 154.

During a subsequent process, some of the carbon in the diffusion barrier layers 154 may diffuse into the adjacent first semiconductor layers 152 and the channel structures 140. However, the concentration of carbon in the diffusion barrier layers 154 may be the highest. The diffusion barrier layers 154 may be identified by image analysis and/or component analysis using transmission electron microscopy (TEM).

Figure 8G:
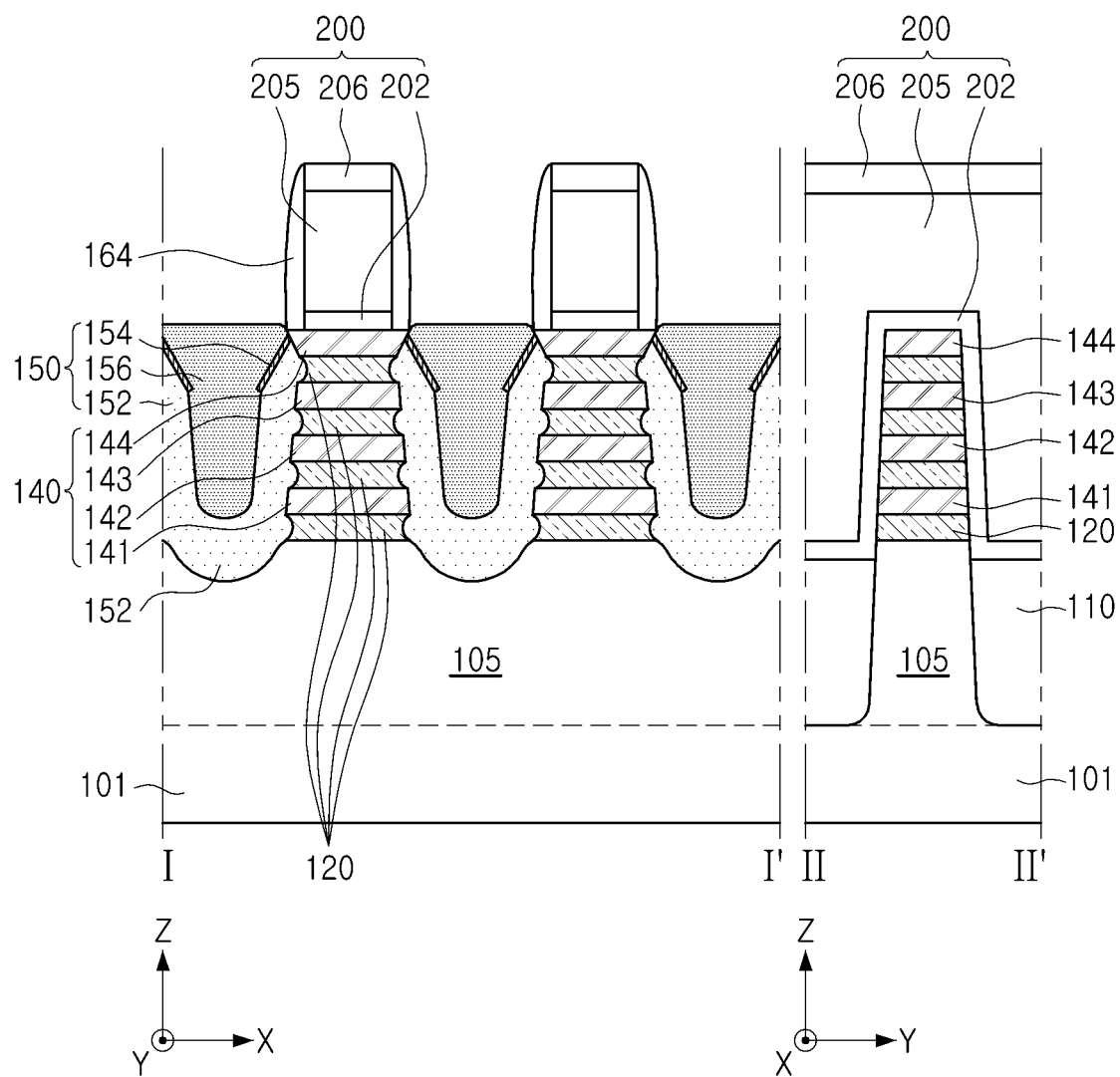

Referring to FIG. 8G, source/drain regions 150 may be formed by forming second semiconductor layers 156 on the first semiconductor layers 152 and the diffusion barrier layers 154.

The second semiconductor layers 156 may be formed to cover the diffusion barrier layers 154 and fill the recess regions RC. The second semiconductor layers 156 may be doped with dopants at a higher concentration than the first semiconductor layers 152.

In upper regions of the source/drain regions 150, the thickness of the first semiconductor layers 152 may be relatively thin. Accordingly, in the upper regions, dopants of the second semiconductor layers 156 may easily diffuse into the channel structure 140 to cause defects due to the short channel effect. However, in example embodiments, because the diffusion barrier layers 154 are disposed in the upper regions, diffusion of such dopants may be prevented or significantly reduced.

Figure 8H:
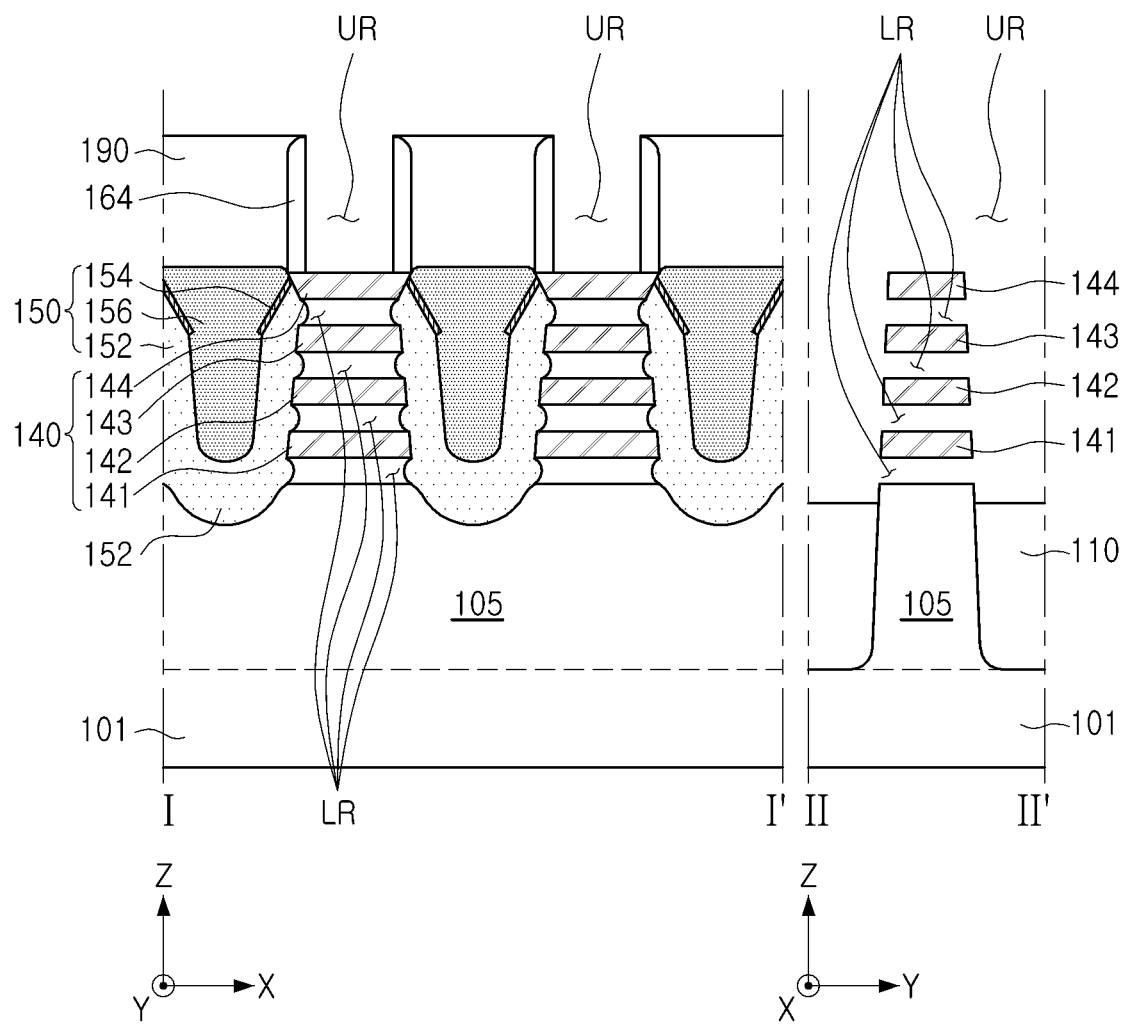

Referring to FIG. 8H, the interlayer insulating layer 190 may be formed, and the sacrificial gate structures 200 and the sacrificial layers 120 may be removed.

The interlayer insulating layer 190 may be formed by forming an insulating film covering the sacrificial gate structures 200 and the source/drain regions 150, and performing a planarization process. The interlayer insulating layer 190 may be formed by exposing the mask pattern layers 206.

The sacrificial gate structures 200 and the sacrificial layers 120 may be selectively removed with respect to the gate spacer layers 164, the interlayer insulating layer 190, and the channel structures 140. First, the sacrificial gate structures 200 are removed to form upper gap regions UR, and lower gap regions LR may be formed by removing the sacrificial layers 120 exposed through the upper gap regions UR. When the sacrificial layers 120 include silicon germanium (SiGe) and the channel structures 140 include silicon (Si), the sacrificial layers 120 may be selectively removed with respect to the channel structures 140 by performing a wet etching process.

Figure 8I:
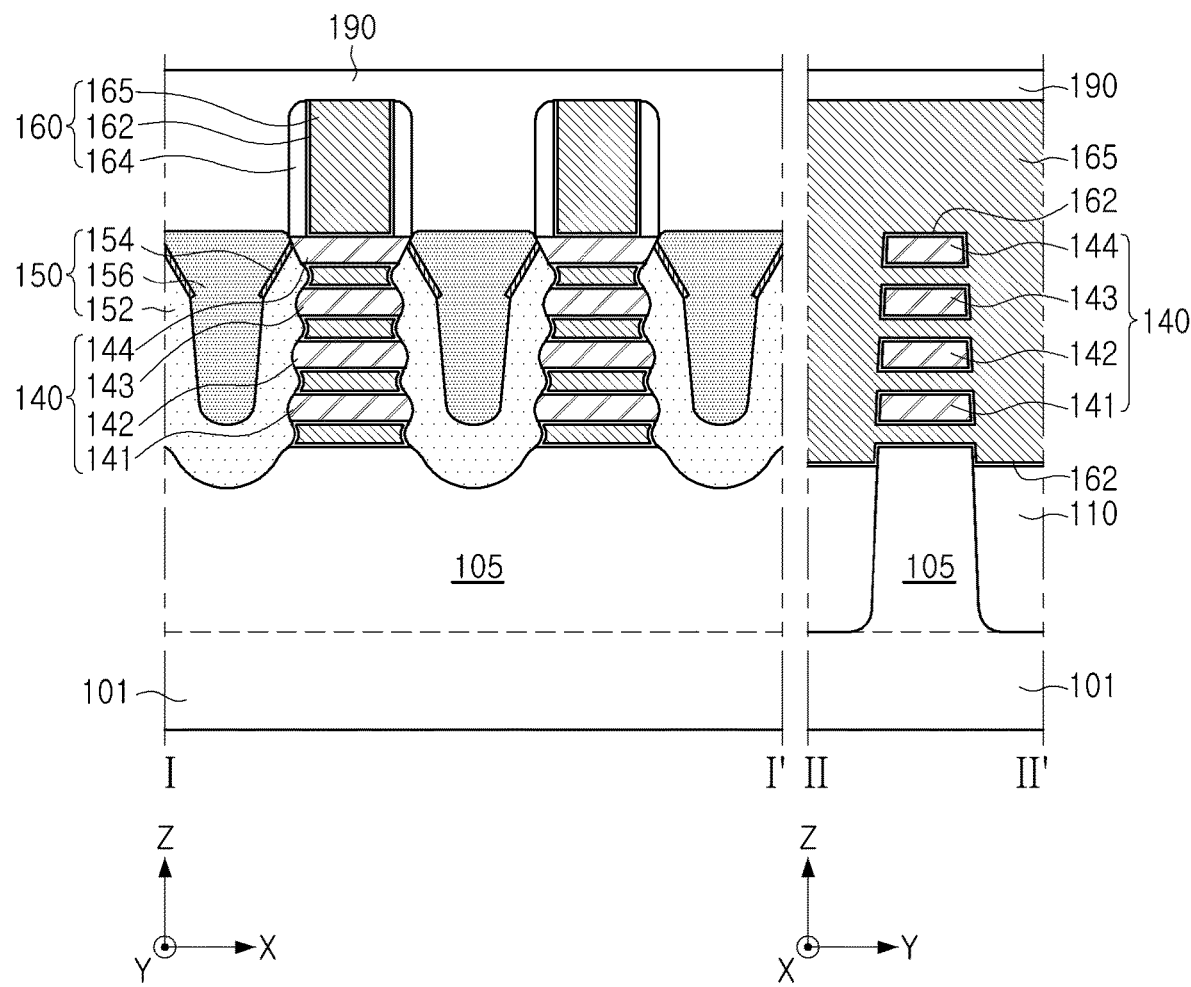

Referring to FIG. 8I, gate structures 160 may be formed.

The gate structures 160 may be formed to fill the upper gap regions UR and the lower gap regions LR. The gate dielectric layers 162 may be formed to conformally cover inner surfaces of the upper gap regions UR and the lower gap regions LR. After the gate electrode 165 is formed to completely fill the upper gap regions UR and the lower gap regions LR, the gate dielectric layers 162 and the gate spacer layers 164 may be removed from the top in the upper gap regions UR to a predetermined depth. Accordingly, the gate structures 160, each including the gate dielectric layers 162, the gate electrode 165, and the gate spacer layers 164, may be formed.

After the gate structure 160 is formed, an interlayer insulating layer 190 may be further formed on the gate structure 160.

Referring to FIG. 2 together, contact plugs 180 may be formed.

Contact holes exposing the source/drain regions 150 may be formed by patterning the interlayer insulating layer 190. Contact plugs 180 may be formed by filling the contact holes with a conductive material.

In detail, after depositing a material forming a barrier layer in the contact holes, a silicide process may be performed to form a metal-semiconductor compound layer such as a silicide layer at the bottom of the contact holes. A conductive material may be deposited to fill the contact holes and form contact plugs 180. Accordingly, the semiconductor device 100 of FIGS. 1 to 3 may be manufactured.

As set forth above, as the source/drain regions include a diffusion barrier layer disposed in the upper region, a semiconductor device having improved reliability may be provided by preventing dopant diffusion from the source/drain region to the channel layers.

While aspects of example embodiments have been illustrated and described above, it will be apparent to those skilled in the art that modifications and variations could be made without departing from the scope of the present inventive concept as defined by the appended claims.

What is claimed is:

1. A semiconductor device comprising:
    a substrate comprising an active region extending in a first direction;
    a gate structure extending in a second direction and intersecting the active region, on the substrate;
    a plurality of channel layers on the active region, spaced apart from each other in a third direction perpendicular to an upper surface of the substrate, and surrounded by the gate structure; and
    a source/drain region on the active region adjacent the gate structure and connected to the plurality of channel layers,
    wherein the source/drain region comprises:
        a first semiconductor layer on side surfaces of the plurality of channel layers;
        a diffusion barrier layer on an upper region of the first semiconductor layer and comprising carbon, wherein an upper surface of a first channel layer that is a lowermost channel layer among the plurality of channel layers is provided between the substrate and a lower end of the diffusion barrier layer; and
        a second semiconductor layer on the diffusion barrier layer and the first semiconductor layer.

2. The semiconductor device of claim 1, wherein the lower end of the diffusion barrier layer is between an upper surface and a lower surface of a second channel layer disposed second from a top among the plurality of channel layers.

3. The semiconductor device of claim 1, wherein the diffusion barrier layer extends in a direction oblique to the first direction and the third direction.

4. The semiconductor device of claim 1, wherein the diffusion barrier layer extends along a crystal plane in the upper region of the first semiconductor layer.

5. The semiconductor device of claim 4, wherein the crystal plane is a {111} plane.

6. The semiconductor device of claim 1, wherein a thickness of the diffusion barrier layer is in a range of about 0.1 nm to about 5.0 nm.

7. The semiconductor device of claim 1, wherein a carbon (C) concentration of the diffusion barrier layer is in a range of about $1 \times 10^{18}/cm^3$ to about $5 \times 10^{21}/cm^3$.

8. The semiconductor device of claim 1, wherein the first semiconductor layer has a first thickness in the upper region and a second thickness greater than the first thickness in a lower region between the substrate and the upper region.

9. The semiconductor device of claim 1, wherein the first semiconductor layer has a third thickness on the side surfaces of the plurality of channel layers, and has a fourth thickness greater than the third thickness on an upper surface of the active region.

10. The semiconductor device of claim 1, wherein the first semiconductor layer has a side surface convexly protruding toward the gate structure, below each of the plurality of channel layers.

11. The semiconductor device of claim 1, wherein a concentration of impurities in the second semiconductor layer is higher than a concentration of impurities in the first semiconductor layer.

12. The semiconductor device of claim 1, wherein a germanium (Ge) concentration of the second semiconductor layer is higher than a germanium (Ge) concentration of the first semiconductor layer.

13. The semiconductor device of claim 1, further comprising a contact plug that extends into an upper portion of the source/drain region, wherein in the first direction, the lower end of the diffusion barrier layer is spaced apart from the contact plug by a first distance, and an upper end of the diffusion barrier layer is spaced apart from the contact plug by a second distance greater than the first distance.

14. The semiconductor device of claim 1, wherein the source/drain region further comprises a third semiconductor layer between the first semiconductor layer and the second semiconductor layer,
wherein the third semiconductor layer is provided on the diffusion barrier layer.

15. A semiconductor device comprising:
a substrate comprising an active region extending in a first direction;
a gate structure on the substrate, intersecting the active region and extending in a second direction; and
a source/drain region provided in a recess region defined by the active region adjacent the gate structure,
wherein the source/drain region comprises:
a first semiconductor layer on an inner side surface of the recess region;
diffusion barrier layers on upper ends of the first semiconductor layer and extending in directions oblique to the first direction; and
a second semiconductor layer on the diffusion barrier layers and the first semiconductor layer, and
wherein the diffusion barrier layers are spaced apart from each other in the source/drain region in the first direction.

16. The semiconductor device of claim 15, wherein the first semiconductor layer has a first thickness in a region in contact with the diffusion barrier layers, and a second thickness greater than the first thickness in a region between the substrate and the diffusion barrier layers.

17. The semiconductor device of claim 15, wherein the diffusion barrier layers comprise carbon (C), and at least one of silicon (Si) or germanium (Ge).

18. The semiconductor device of claim 15, further comprising a contact plug that extends into an upper portion of the source/drain region,
wherein the diffusion barrier layers are spaced apart from the contact plug.

19. A semiconductor device comprising:
a substrate comprising an active region extending in a first direction;
a gate structure on the substrate, intersecting the active region, and extending in a second direction;
a plurality of channel layers on the active region, spaced apart from each other in a third direction perpendicular to an upper surface of the substrate, and surrounded by the gate structure; and
a source/drain region on the active region adjacent the gate structure, and connected to the plurality of channel layers,
wherein the source/drain region comprises:
a first semiconductor layer on side surfaces of the plurality of channel layers;
a second semiconductor layer on the first semiconductor layer; and
a plurality of diffusion barrier layers between the first semiconductor layer and the second semiconductor layer.

20. The semiconductor device of claim 19, wherein a first channel layer, among the plurality of channel layers, is provided between the substrate and lower ends of the plurality of diffusion barrier layers.

* * * * *